(12) United States Patent
Kim et al.

(10) Patent No.: US 8,197,284 B2
(45) Date of Patent: Jun. 12, 2012

(54) PRINTED CIRCUIT BOARD ASSEMBLY AND CONNECTING METHOD THEREOF

(75) Inventors: Hyun Tae Kim, Suwon-si (KR); Tae Sang Park, Seoul (KR); Young Jun Moon, Hwaseong-si (KR); Soon Min Hong, Seoul (KR); Hyo Young Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/659,607

(22) Filed: Mar. 15, 2010

(65) Prior Publication Data
US 2010/0248505 A1   Sep. 30, 2010

(30) Foreign Application Priority Data

Mar. 25, 2009 (KR) .................. 10-2009-0025345

(51) Int. Cl.
*H01R 13/58* (2006.01)

(52) U.S. Cl. .................. 439/606; 439/874; 29/25.03

(58) Field of Classification Search .................. 439/606, 439/874; 29/25.03
See application file for complete search history.

(56) References Cited

U.S. PATENT DOCUMENTS

| | | | |
|---|---|---|---|
| 5,716,420 A * | 2/1998 | Kuriyama | 29/25.03 |
| 6,128,195 A * | 10/2000 | Weber et al. | 361/737 |
| 7,667,976 B2 * | 2/2010 | Sugimoto et al. | 361/760 |

* cited by examiner

*Primary Examiner* — Truc Nguyen
(74) *Attorney, Agent, or Firm* — Harness, Dickey & Pierce, P.L.C.

(57) ABSTRACT

Disclosed herein is a printed circuit board and a connecting method thereof. The connecting method of the circuit board assembly may include molding the printed circuit board assembly by applying a resin to the printed circuit board assembly, exposing ends of the electrode terminals of a connector mounted on a printed circuit board by partially removing the molded printed circuit board assembly, and connecting a connection member to the exposed ends of the electrode terminals of the connector. Therefore, even if the whole of the printed circuit board assembly is molded, the connection member may be freely connected to the connector of the printed circuit board assembly.

6 Claims, 22 Drawing Sheets

PRINTED CIRCUIT BOARD ASSEMBLY AND CONNECTING METHOD THEREOF

CROSS-REFERENCE TO RELATED APPLICATION

This application claims priority under 35 U.S.C. §119 to Korean Patent Application No. 2009-0025345, filed on Mar. 25, 2009 in the Korean Intellectual Property Office (KIPO), the entire contents of which are incorporated herein by reference.

BACKGROUND

1. Field

Example embodiments relate to a printed circuit board assembly, in which a connection member is connected to a connector of the printed circuit board assembly, and a connecting method thereof.

2. Description of the Related Art

The electronic communication industry has been rapidly developed and many instruments relating to the electronic communication industry have been introduced. These instruments have been miniaturized and functions thereof have been diversified. Elements to achieve the corresponding functions have been miniaturized also and have performed a wider variety of functions.

In order to reduce a size of an instrument, a thickness of a printed circuit board assembly including a printed circuit board installed in the instrument and an element mounted on the printed circuit board has been reduced. However, printed circuit boards having reduced thicknesses may be easily broken when subject to falling or external impact. Therefore, in order to prevent or reduce the above breakage, the overall printed circuit board assembly is molded by applying a resin to the printed circuit board assembly. However, if the overall printed circuit board assembly is molded, the resin is applied to the inside of a connector mounted on the printed circuit board, and thus a flexible printed circuit board may not be connected to the connector.

SUMMARY

Example embodiments provide a printed circuit board assembly, in which a connection member may be connected to a connector of the printed circuit board assembly even though the overall printed circuit board assembly is molded. Example embodiments also provide for a connecting method thereof.

Example embodiments will be set forth in part in the description which follows and, in part, will be obvious from the description, or may be learned by practice of example embodiments.

In accordance with example embodiments, a connecting method of a printed circuit board assembly may include molding the printed circuit board assembly by applying a resin to the printed circuit board assembly, exposing ends of electrode terminals of a connector mounted on a printed circuit board by partially removing the molded printed circuit board assembly, and connecting a connection member to the exposed ends of the electrode terminals of the connector.

In the exposure of the ends of the electrode terminals of the connector mounted on the printed circuit board by partially removing the molded printed circuit board assembly, the ends of the electrode terminals of the connector may be exposed by partially removing the connector.

In the exposure of the ends of the electrode terminals of the connector mounted on the printed circuit board by partially removing the molded printed circuit board assembly, one opened surface of the connector and the ends of the electrode terminals of the connector may be exposed by partially removing the connector.

In the connection of the connection member to the exposed ends of the electrode terminals of the connector, the connection member may be connected to the electrode terminals of the connector by inserting the connection member to the opened surface of the connector.

In example embodiments, the height of a hole of the opened surface of the connector may be smaller than the thickness of the connection member.

The connection of the connection member to the exposed ends of the electrode terminals of the connector may be achieved by a direct connection method.

In accordance with example embodiments, a printed circuit board assembly may include a printed circuit board and a connector mounted on the printed circuit board. In example embodiments, the connector may be electrically connected with a connection member, wherein a portion of the connector is exposed, and the remainder of the connector is molded.

The connector may include a body part and a contact part formed within the body part. The connector may be provided with a plurality of electrode terminals arranged at a designated separation distance.

The connector may include a body part and a contact part formed within the body part. The connector may be provided with a plurality of electrode terminals arranged at a designated separation distance, and an insertion hole, into which the connection member is inserted, formed in the body part.

Ends of the electrode terminals may contact the printed circuit board, and the other ends of the electrode terminals may contact the connection member.

The height of the insertion hole may be smaller than the thickness of the connection member.

BRIEF DESCRIPTION OF THE DRAWINGS

Example embodiments will be more clearly understood from the following detailed description taken in conjunction with the accompanying drawings. FIGS. 1A-6F represent non-limiting, example embodiments as described herein.

FIG. 1A is a perspective view of a printed circuit board assembly in accordance with example embodiments;

FIGS. 6A to 6F are longitudinal-section views sequentially illustrating a process of connecting a flexible printed circuit board to the printed circuit board assembly in accordance with example embodiments illustrated in FIGS. 4A to 4C.

DETAILED DESCRIPTION

Figure 1A:
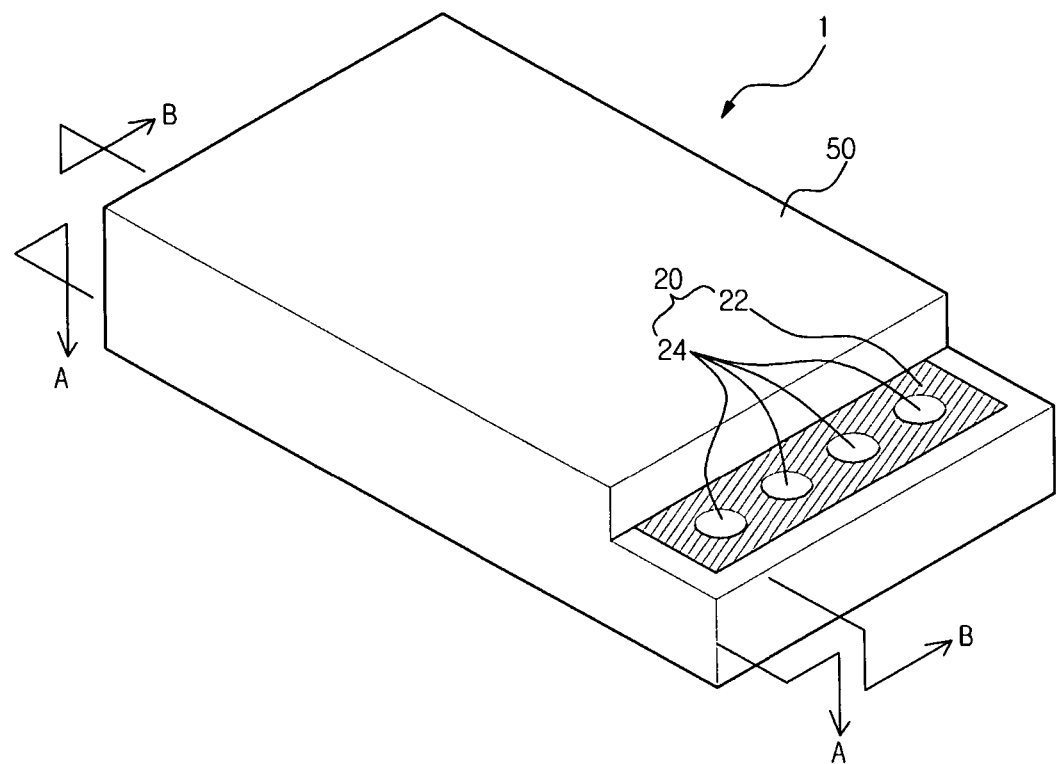

Example embodiments will now be described more fully with reference to the accompanying drawings, in which example embodiments are shown. The invention may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Reference will now be made in detail to example embodiments illustrated in the accompanying drawings, wherein like reference numerals refer to the like elements throughout.

Figure 1B:
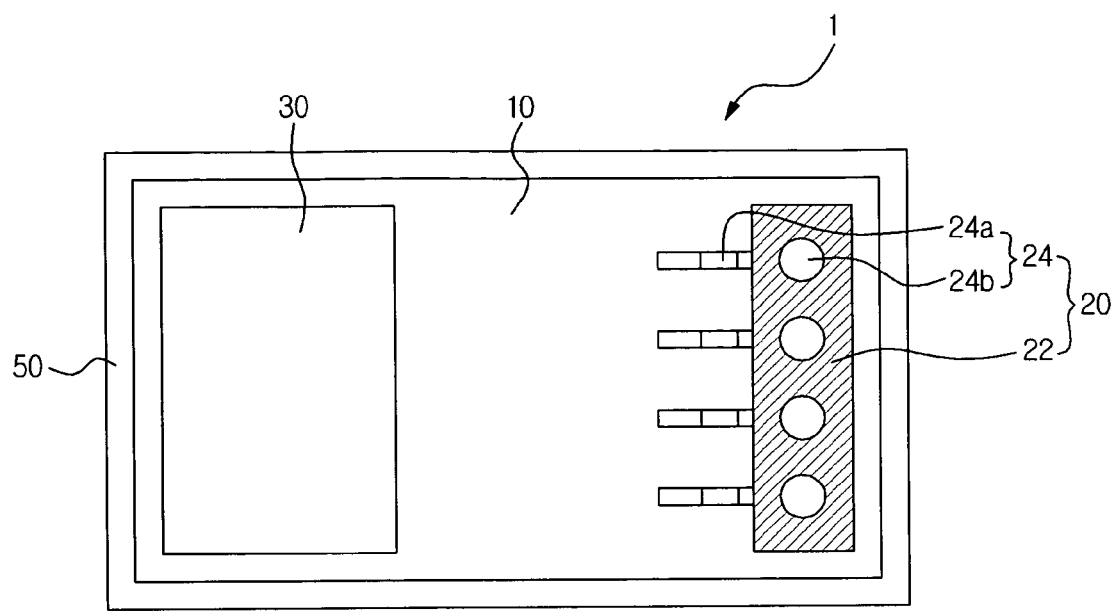
FIG. 1B is a transverse-section view taken along the line A-A of FIG. 1A.
Figure 1C:
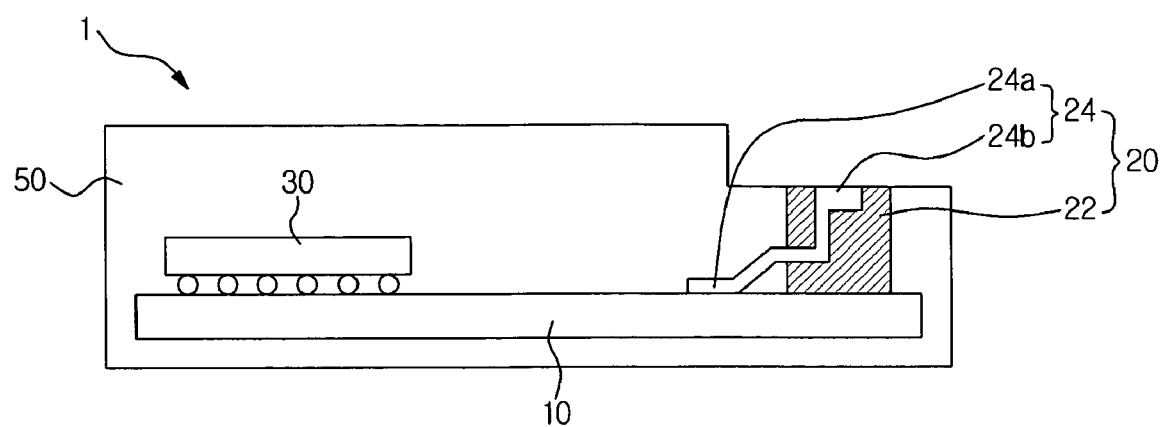
FIG. 1C is a longitudinal-section view taken along the line B-B of FIG. 1A.

FIG. 1A is a perspective view of a printed circuit board assembly in accordance with example embodiments, FIG. 1B is a transverse-section view taken along the line AA of FIG. 1A, and FIG. 1C is a longitudinal-section view taken along the line B-B of FIG. 1A.

As shown in FIGS. 1A to 1C, a printed circuit board assembly 1 in accordance with example embodiments may include a printed circuit board 10, a connector 20, and a circuit element 30.

The printed circuit board 10 may include a metal wire disposed therein. The metal wire may allow various electronic parts, including the circuit element 30, to be mounted on the printed circuit board 10 to form a circuit.

The connector 20 may include a body part 22 and a contact part 24. The connector 20 may be mounted on the printed circuit board 10. The connector may be configured to electrically connect to the printed circuit board 10 to transmit and receive electrical signals between the printed circuit board 10 and the outside or to supply power. For example, the connector 20 may be configured to connect to an external connection member 40 (see, for example, FIG. 5E) to transmit various electrical signals to and/or from the external connection member 40 to and/or from the printed circuit board 10. Thus, the function of semiconductor fabricating equipment may be controlled.

Hereinafter, components of the connector 20 will be described in detail. The body part 22 may accommodate a connection member 40 inserted from the outside, e.g., the flexible printed circuit board 40 illustrated in FIG. 5E.

The contact part 24 may be provided with a plurality of electrode terminals, which may be separated from each other by a designated distance. The contact part 24 may be configured to connect with a plurality of terminals 42 that may be formed on a flexible printed circuit board 40. For example, the contact part 24 may be configured to connect with a plurality of terminals 42 that may be formed on the flexible printed circuit board 40 in a one to one manner. As shown in FIGS. 1A-1C, the contact part 24 may be formed within the body part 22. Although the above description described the contact part 24 has having a plurality of electrode terminals connecting to a plurality of terminals 42 in a one to one manner, example embodiments are not limited thereto.

Ends 24a of the electrode terminals may contact the printed circuit board 10, and other ends 24b of the electrode terminals may be configured to contact the flexible printed circuit board 40. The electrode terminals may electrically connect the printed circuit board 10 to the flexible printed circuit board 40. These electrode terminals are made of a conductive material, and may be arranged at a uniform separation distance.

A portion of the connector 20, e.g., the ends 24b of the electrode terminals, may be exposed to the outside, and the remainder of the connector 20 may be molded with a resin 50 applied thereto.

Because the ends 24b of the electrode terminals, being a portion of the connector 20, may be configured to contact the terminals 42 formed on the flexible printed circuit board 40, and because the whole of the printed circuit board assembly 1 except for a portion of the connector 20 may be molded with a resin 50, the overall rigidity of the printed circuit board assembly 1 may be increased.

Figure 2A:
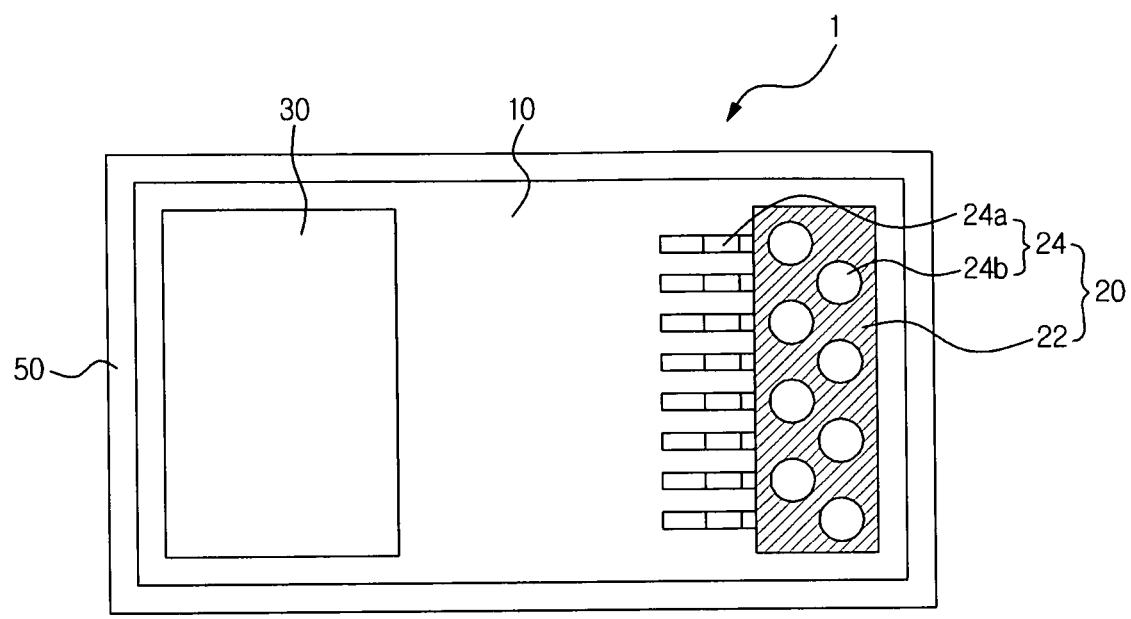
FIGS. 2A and 2B are views illustrating modifications of a connector of the printed circuit board assembly of FIG. 1B.
Figure 2B:
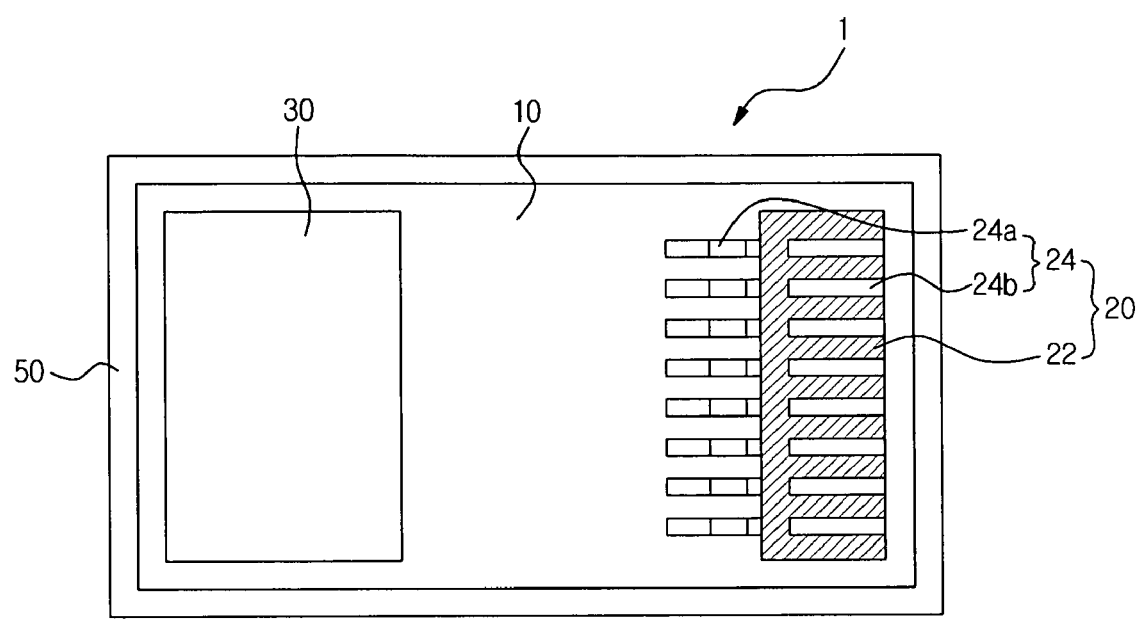
Figure 3A:
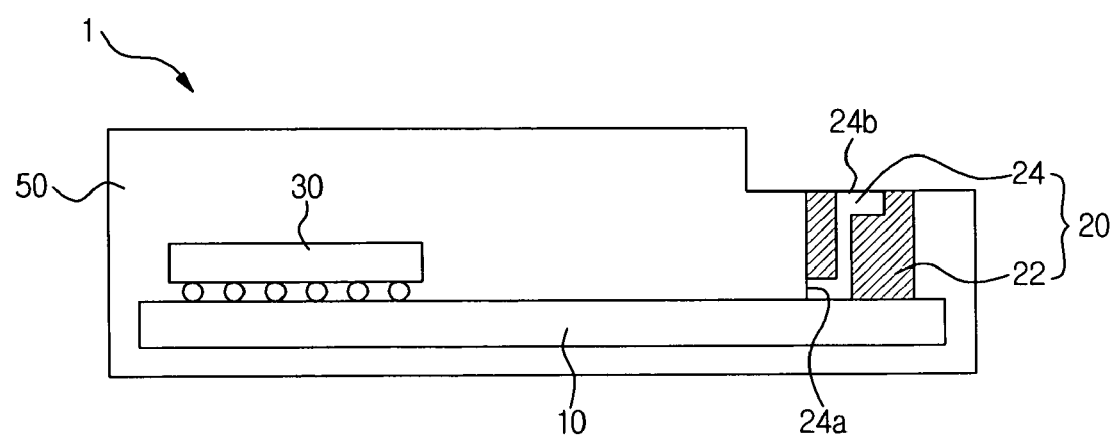
FIGS. 3A and 3B are views illustrating modifications of the connector of the printed circuit board assembly of FIG. 1C.
Figure 3B:
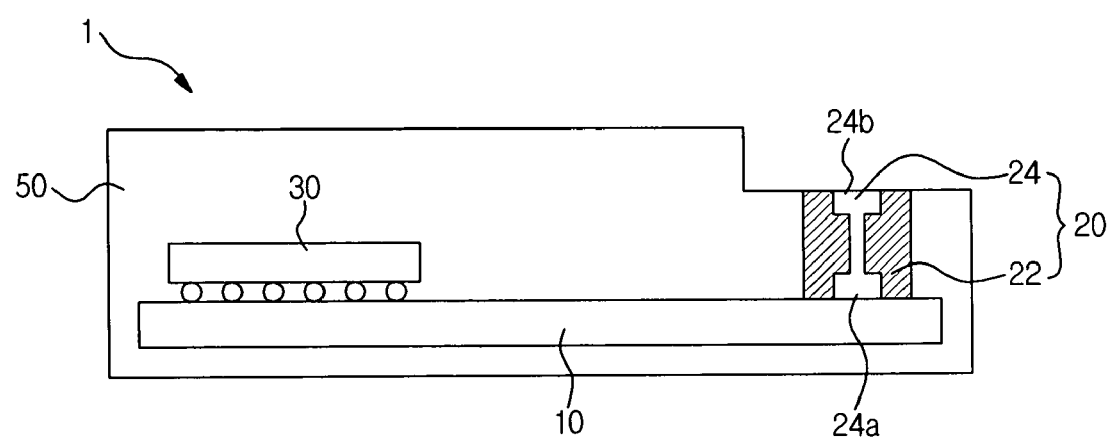

FIGS. 2A and 2B are views illustrating modifications of the connector of the printed circuit board assembly of FIG. 1B, and FIGS. 3A and 3B are views illustrating modifications of the connector of the printed circuit board assembly of FIG. 1C.

With reference to FIGS. 2A and 2B, the shape and arrangement of the ends 24b of the electrode terminals configured to contact the terminals 42 of the flexible printed circuit board 40 may be varied according to the shape of the terminals 42 of the printed circuit board 40. FIG. 2A illustrates that the ends 24b of the electrode terminals having a circular shape may be arranged in a zigzag line, and FIG. 2B illustrates that the ends 24b of the electrode terminals having a rectangular shape may be arranged in a line. In example embodiments, the shapes of the ends 24b of the electrode terminals 24 contacting the printed circuit board 10 may be varied in order to reduce or minimize the mount area of the connector 20.

As shown in FIG. 3A, the ends 24a of the electrode terminals may be located at one side surface of a lower portion of the connector 20 and the other ends 24b of the electrode terminals may be located at an upper portion of the connector 20. As shown in FIG. 3A, the ends 24a may contact the printed circuit board 10 and the ends 24b may be configured to contact the flexible printed circuit board 40. Although FIG. 3A illustrates an example of an electrode terminal having ends 24a and 24b at side surfaces of a lower portion of a connector and at an upper portion of the connector, example embodiments are not limited thereto. For example, FIG. 3B illustrates electrode terminals with ends 24a located at a lower portion of the connector 20 and other ends 24b of the electrode terminals located at an upper portion of the connector 20. As shown in FIG. 3B, the ends 24a may contact the printed circuit board and the ends 24b may be configured to contact the flexible printed circuit board 40.

Figure 4A:
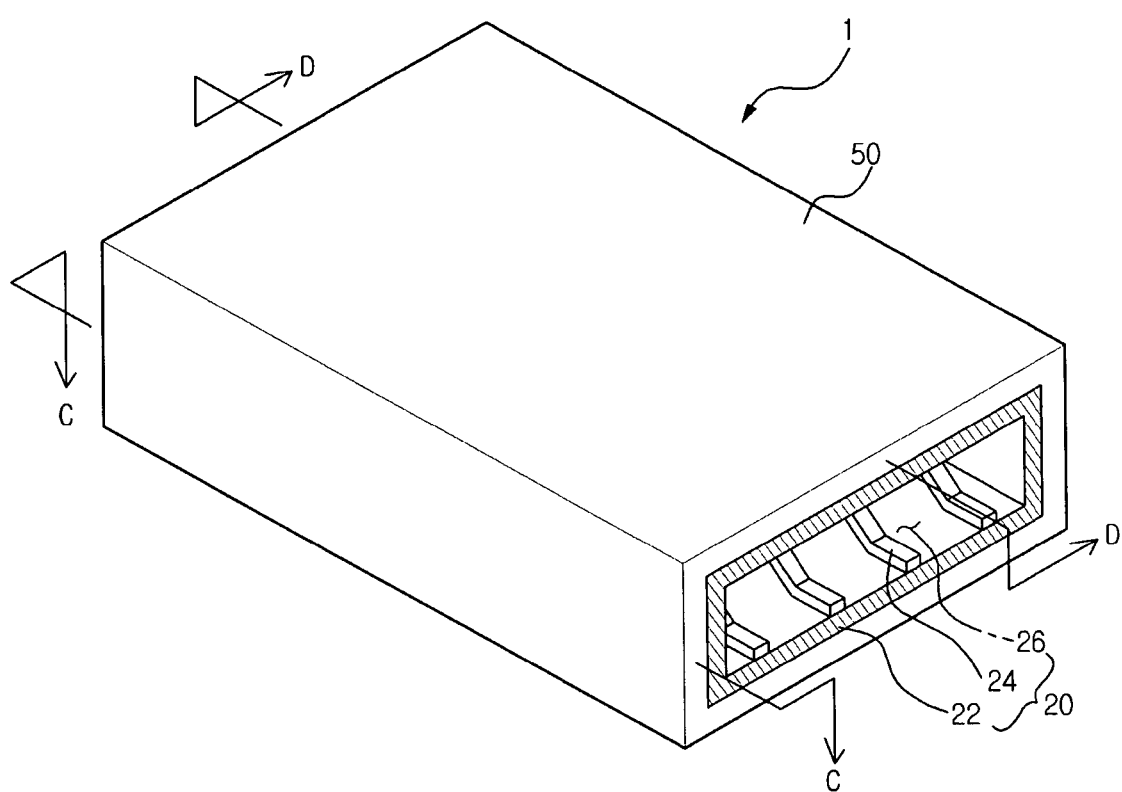
FIG. 4A is a perspective view of a printed circuit board assembly in accordance with example embodiments.
Figure 4B:
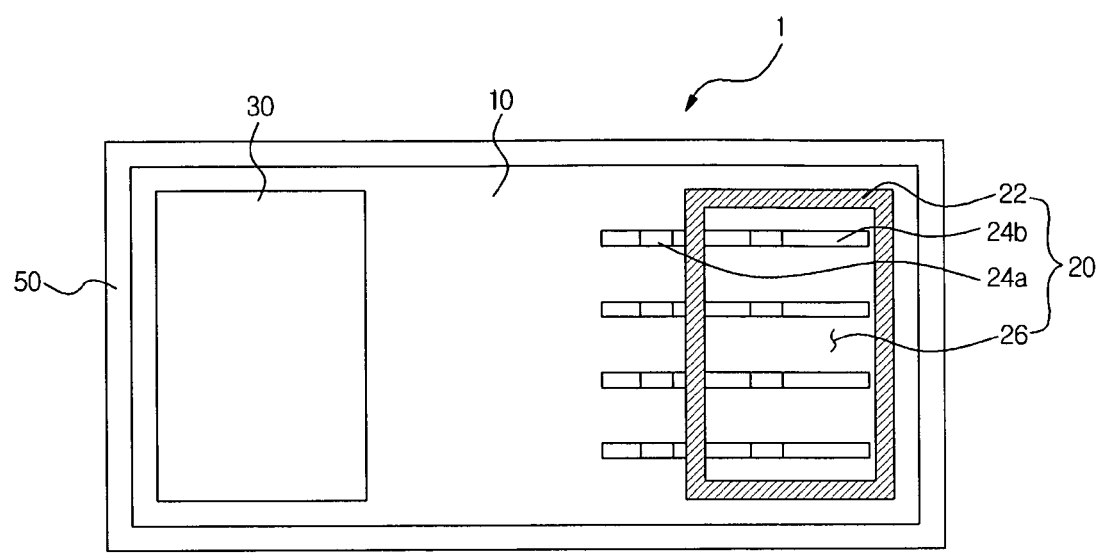
FIG. 4B is a transverse-section view taken along the line C-C of FIG. 4A.
Figure 4C:
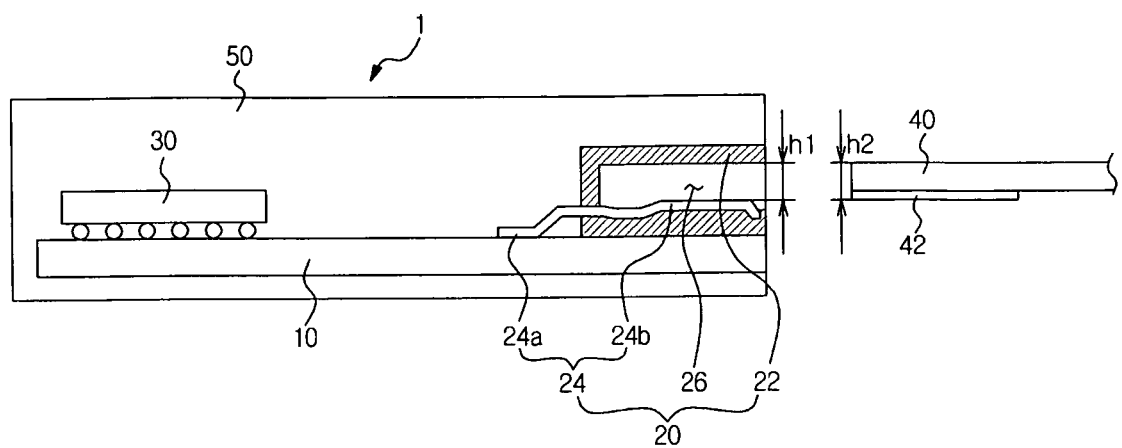
FIG. 4C is a longitudinal-section view taken along the line D-D of FIG. 4A.

FIG. 4A is a perspective view of a printed circuit board assembly in accordance with example embodiments, FIG. 4B is a transverse-section view taken along the line C-C of FIG. 4A, and FIG. 4C is a longitudinal-section view taken along the line D-D of FIG. 4A.

As shown in FIGS. 4A to 4C, a printed circuit board assembly 1 in accordance with example embodiments may include a printed circuit board 10, a connector 20, and a circuit element 30. Some elements of the printed circuit board assembly 1 illustrated in FIGS. 4A-4C are substantially the same as those in the printed circuit board assembly 1 of FIGS. 1A to 1C. These elements are denoted by the same reference numerals as those of the parts denoted in FIGS. 1A to 1C, and a detailed description thereof will thus be omitted because it is considered to be unnecessary.

The connector 20 illustrated in FIGS. 4A-4C may include a body part 22, a contact part 24, and an insertion hole 26. The contact part 24 may be formed within the body part 22, and may include a plurality of electrode terminals, which may be arranged at a designated separation distance. Although example embodiments illustrate the connector 20 as having a plurality of electrode terminals arranged at designated separation distances, example embodiments are not limited thereto.

The insertion hole 26 may be formed in the body part 22 such that a flexible printed circuit board 40 may be inserted into the insertion hole 26. In example embodiments, the electrode terminals may be formed in the lower portion of the insertion hole 26 and may be connected to a plurality of terminals 42 formed on the flexible printed circuit board 40 through a one-to-one correspondence. Although example embodiments describe a plurality of terminals 42 on the flexible printed circuit board 40 being connected to the plurality of terminals 42 through a one-to-one correspondence, example embodiments are not limited thereto as there may be a greater number of terminals 42 than the electrode terminals or there may be a greater number of electrode terminals than the number of terminals 42.

A portion of the connector 20, e.g., ends 24b of the electrode terminals and the insertion hole 26 of the connector 20, may be exposed to the outside, and the remainder of the connector 20 may be molded with a resin 50 applied thereto.

Thereby, the flexible printed circuit board 40 may be inserted into the connector 20, and the ends 24b of the electrode terminals of the connector 20 may contact the terminals 42 formed on the flexible printed circuit board 40. Further, the whole of the printed circuit board assembly 1 except for a portion of the connector 20 may be molded with the resin 50, and thus the overall rigidity of the printed circuit board assembly 1 may be increased.

The height h1 of the insertion hole 26 may be smaller than the thickness h2 of the flexible printed circuit board 40, and thus when the flexible printed circuit board 40 is inserted into the insertion hole 26 of the connector 20, the flexible printed circuit board 40 may be firmly connected to the insertion hole 26.

FIGS. 5A to 5F are longitudinal-section views sequentially illustrating a process of connecting the flexible printed circuit board to a printed circuit board assembly in accordance with example embodiments illustrated in FIGS. 1A to 1C.

Figure 5A:
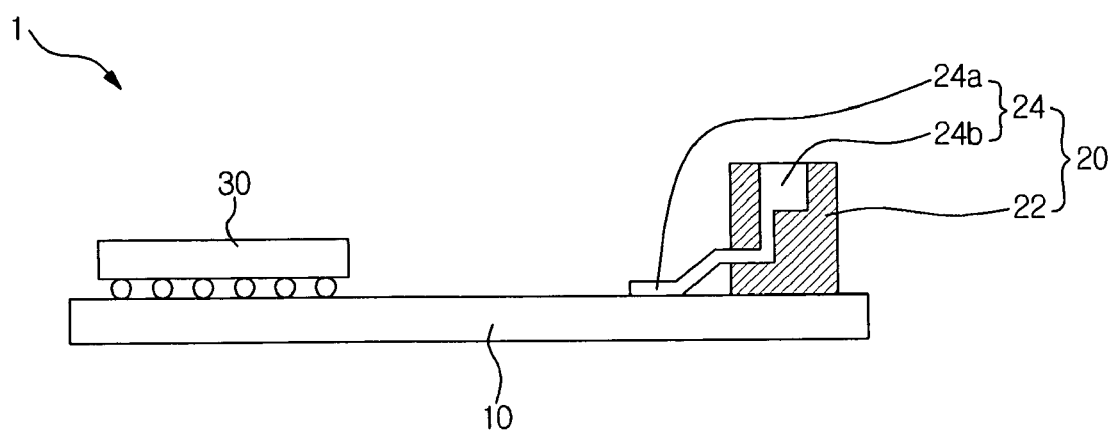
FIGS. 5A to 5F are longitudinal-section views sequentially illustrating a process of connecting a flexible printed circuit board to the printed circuit board assembly in accordance with example embodiments illustrated in FIGS. 1A to 1C.
Figure 5B:
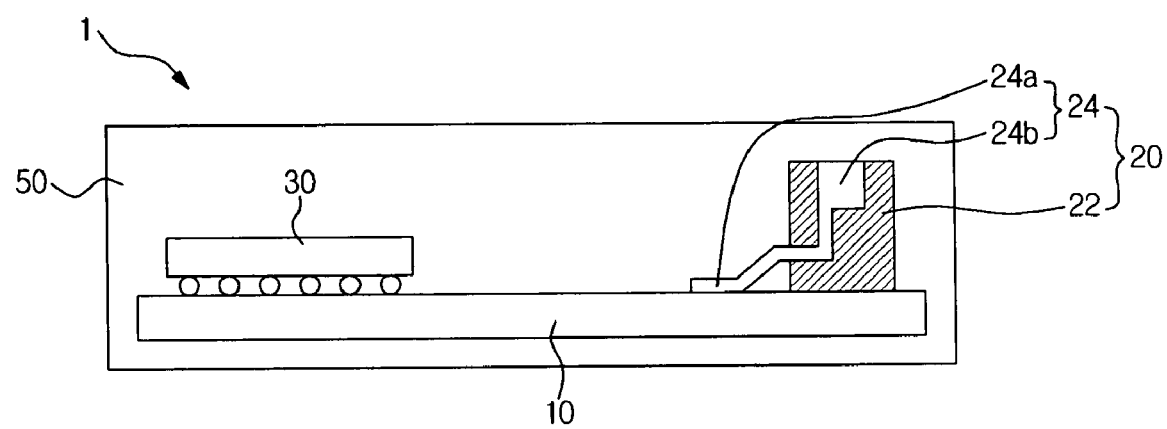

As shown in FIG. 5A, the connector 20 and the circuit element 30 may be mounted on the printed circuit board 10. A resin 50 may be applied to the whole of the printed circuit board assembly 1 provided with the connector 20 and the circuit element 30 and thus may mold the whole of the printed circuit board assembly 1, as shown in FIG. 5B.

Figure 5C:
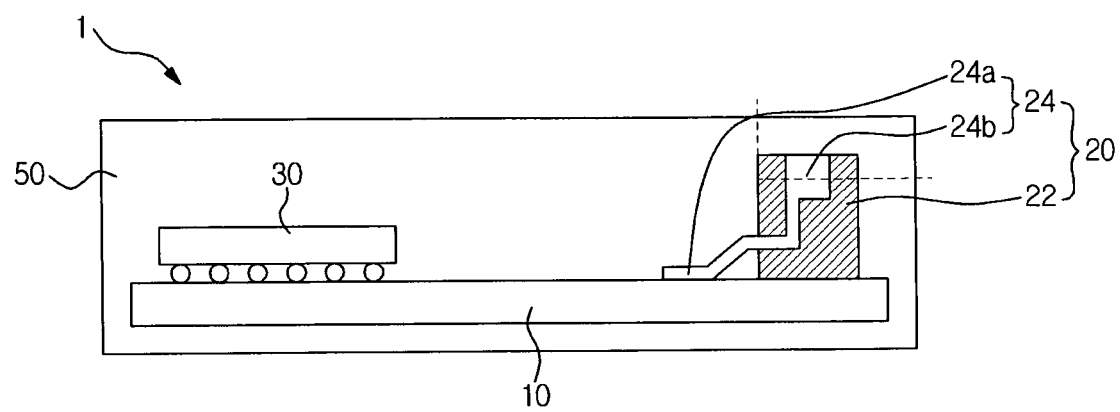
Figure 5D:
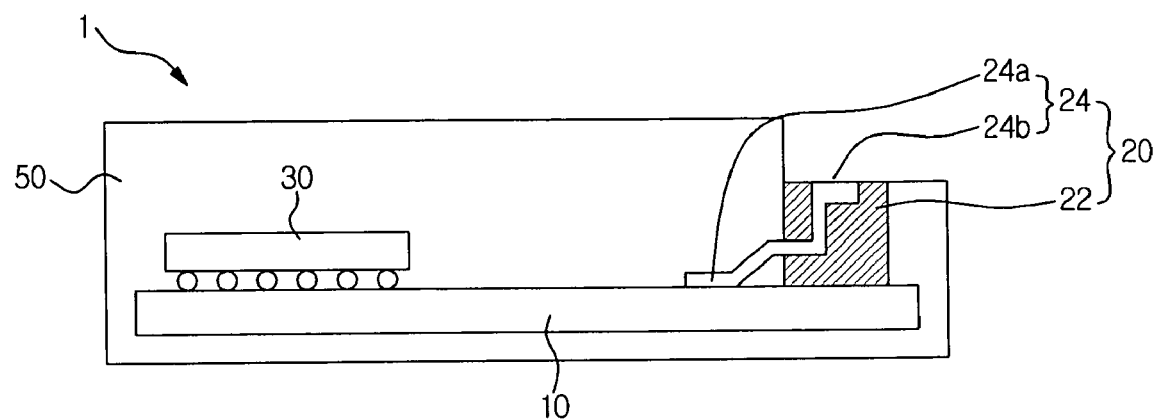
Figure 5E:
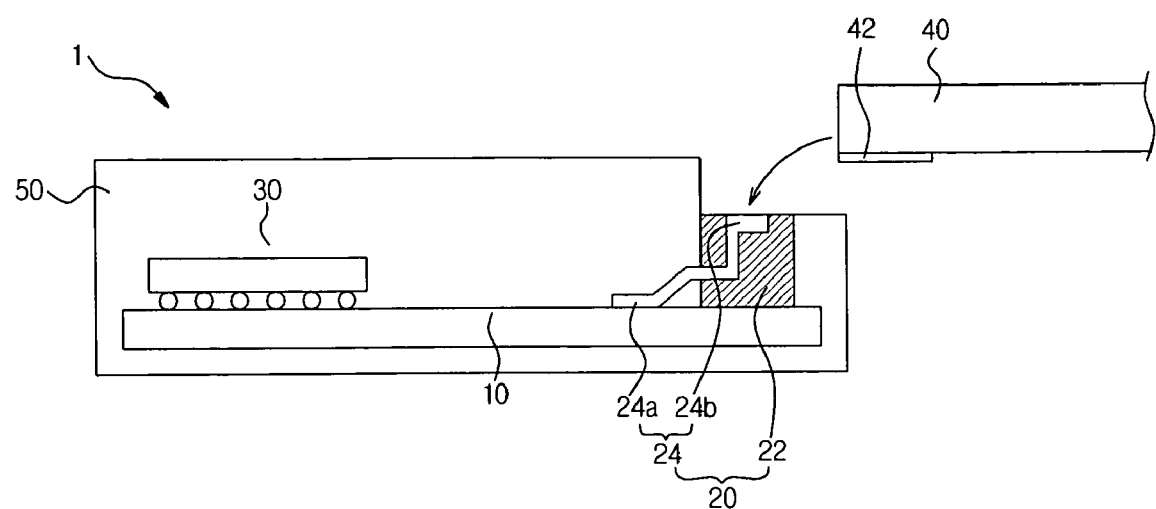
Figure 5F:
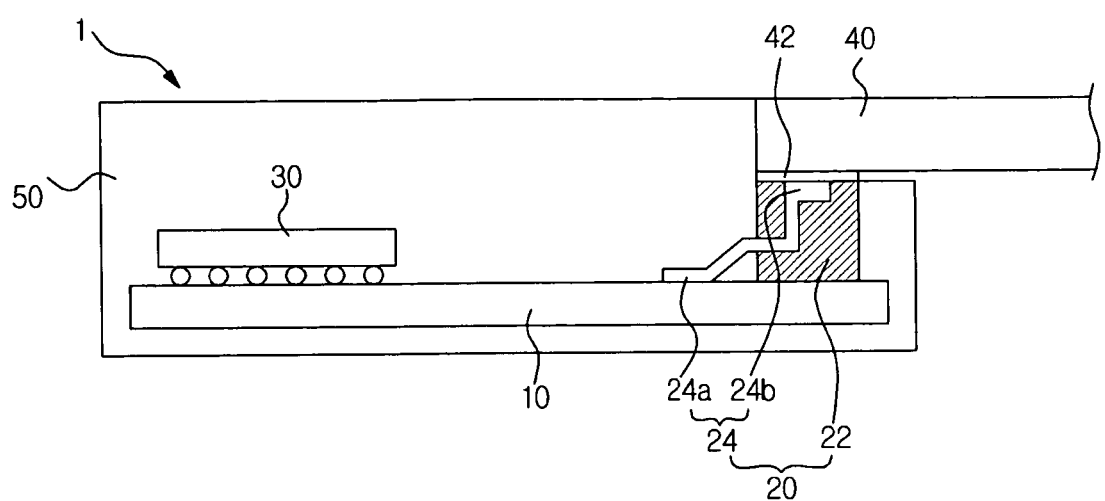

In FIGS. 5C and 5D, the molded printed circuit board assembly 1 may be partially removed, thus exposing the ends 24b of the electrode terminals of the connector 20 mounted on the printed circuit board 10. As shown in FIGS. 5E and 5F, the terminals 42 of the connection member, e.g., the flexible printed circuit board 40, may contact the exposed ends 24b of the electrode terminals of the connector 20, thus connecting the connector 20 and the flexible printed circuit board 40.

In example embodiments, the ends 24b of the electrode terminals of the connector 20 and the terminals 42 of the flexible printed circuit board 40 may be connected using a direct connection method, for example, solder thermocompression, solder slide soldering, or anisotropic conductive film (ACF) thermocompression, thus increasing bonding force between the connector 20 of the printed circuit board assembly 1 and the flexible printed circuit board 40.

FIGS. 6A to 6F are longitudinal-sectional views sequentially illustrating a process of connecting the flexible printed circuit board to the printed circuit board assembly in accordance with example embodiments illustrate in FIGS. 4A to 4C.

Figure 6A:
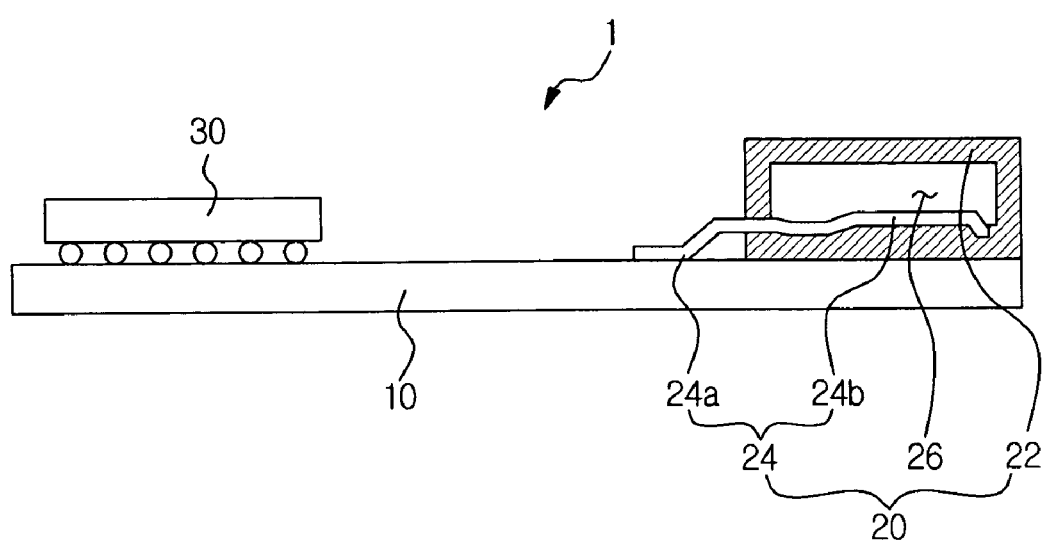
Figure 6B:
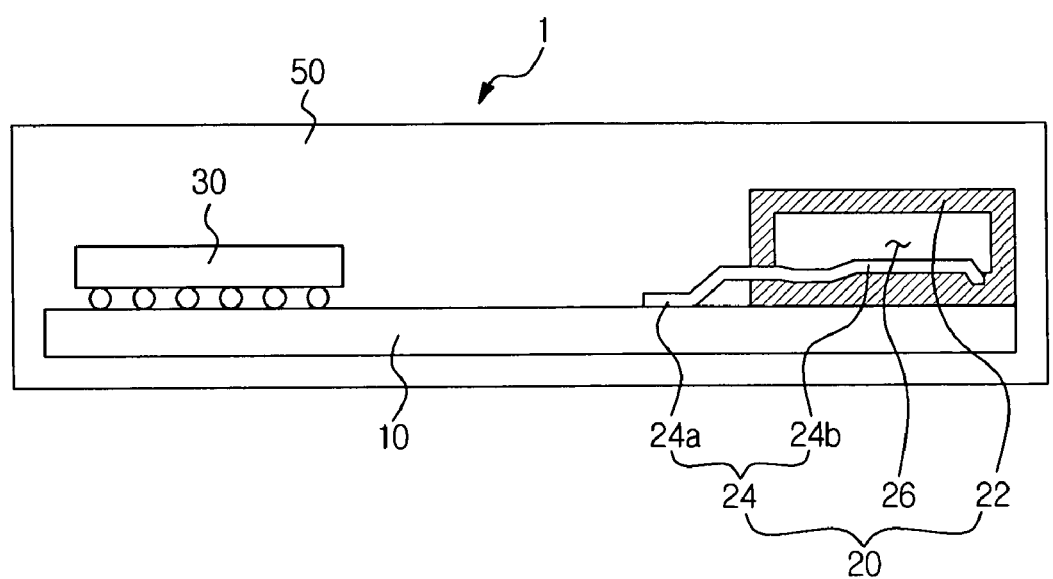
Figure 6C:
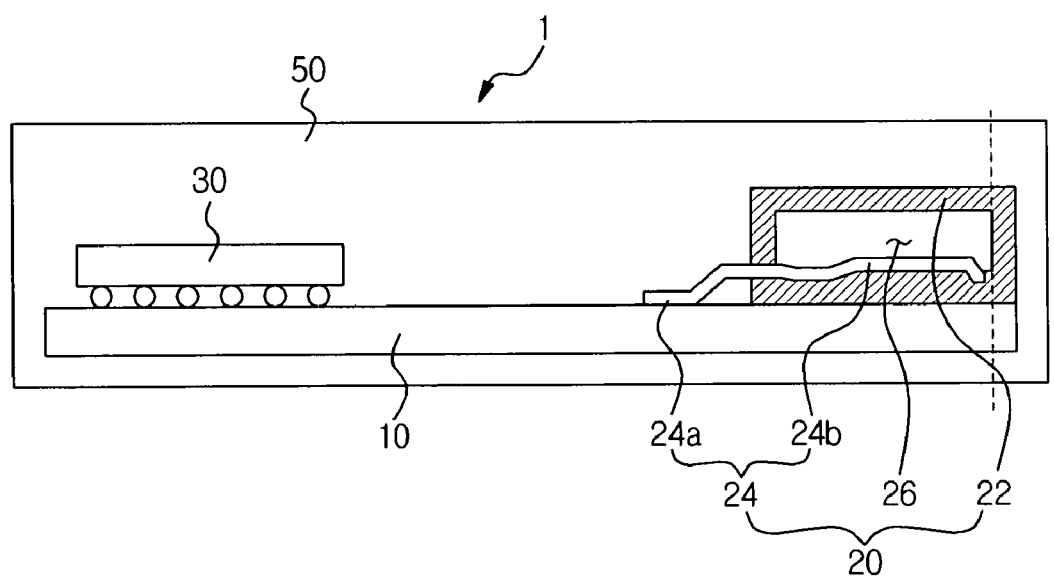
Figure 6D:
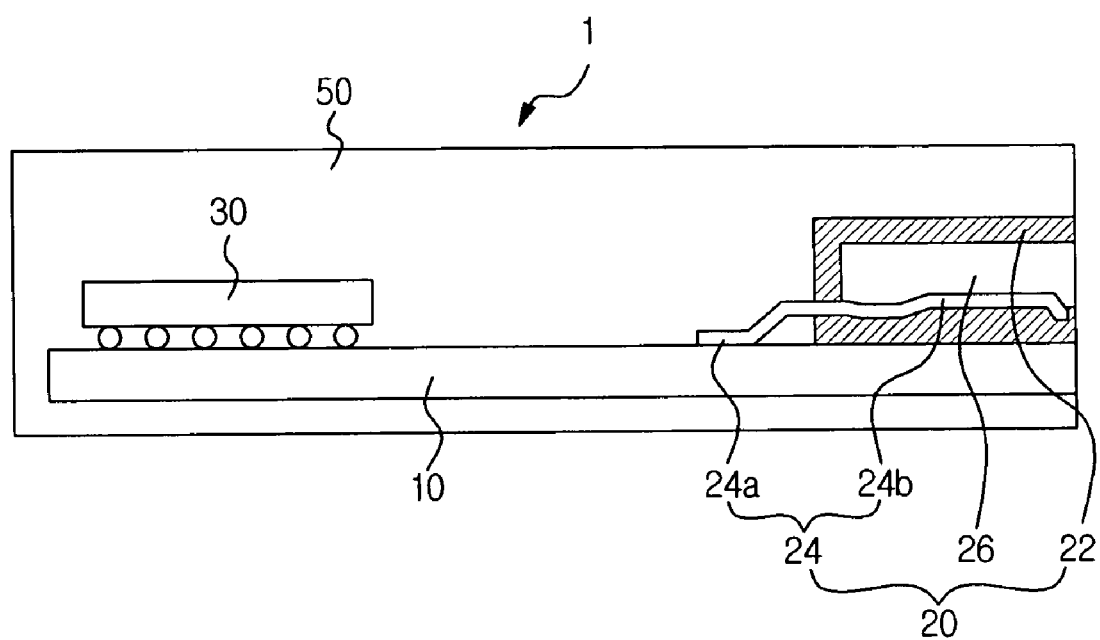

As shown in FIGS. 6A and 6B, the connector 20 and the circuit element 30 may be mounted on the printed circuit board 10 and a resin 50 may be applied to the whole of the printed circuit board assembly 1 provided with the connector 20 and the circuit element 30 and to mold the whole of the printed circuit board assembly 1. In example embodiments, as shown in FIGS. 6C and 6D, the molded printed circuit board assembly 1 may be partially removed to expose the ends 24b of the electrode terminals and one opened surface of the connector 20 mounted on the printed circuit board 10.

Figure 6E:
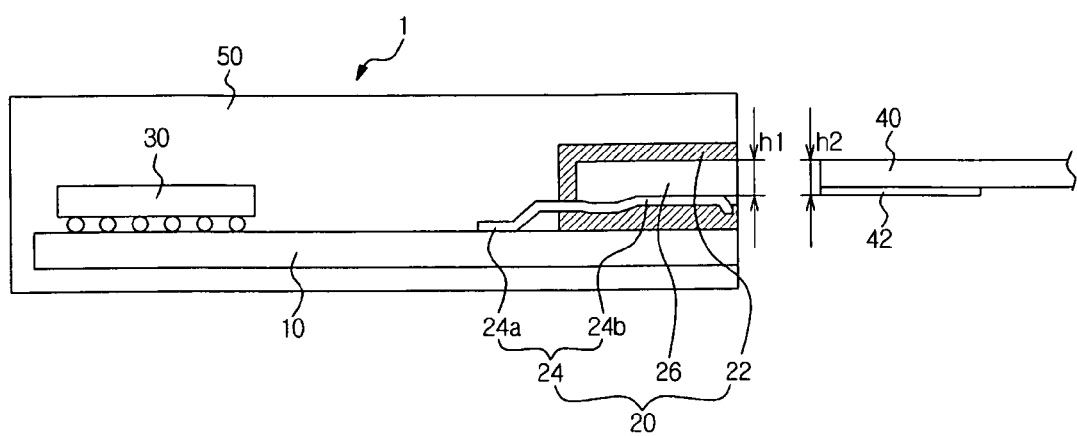
Figure 6F:
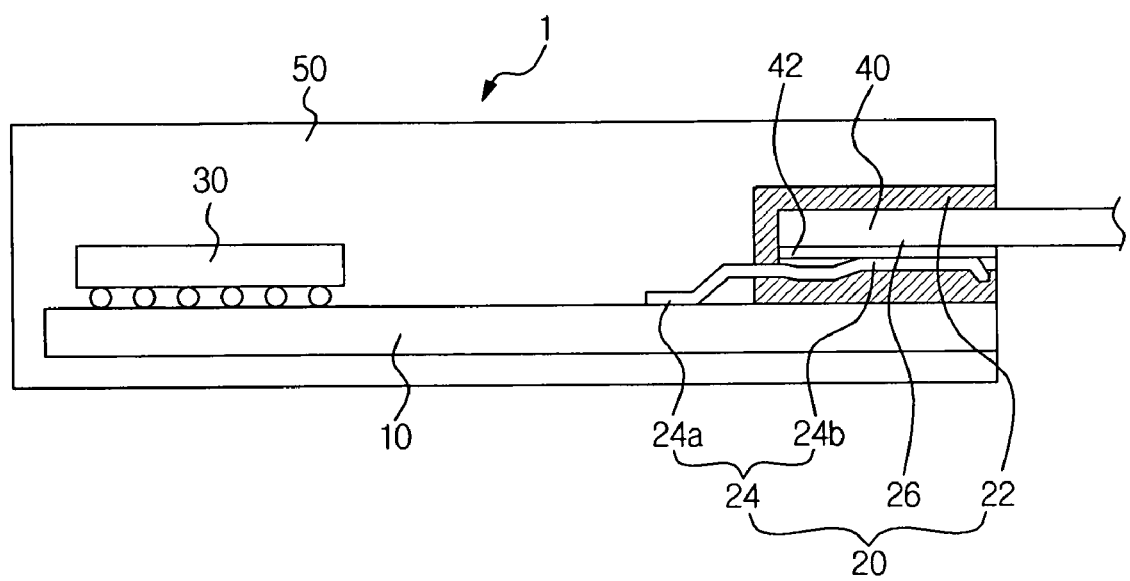

As shown in FIGS. 6E and 6F, the terminals 42 of the flexible printed circuit board 40 may contact the ends 24b of the electrode terminals of the connector 20 by inserting the flexible printed circuit board 40 into the opened surface of the connector 20, thus connecting the connector 20 to the flexible printed circuit board 40.

In example embodiments, the height h1 of the opened surface of the connector 20 may be smaller than the thickness h2 of the flexible printed circuit board 40, thus the flexible printed circuit board 40 inserted into the connector 20 may be firmly connected to the connector 20.

Through the above configuration, even if the whole of the printed circuit board assembly 1 is molded, the flexible printed circuit board 40 may be freely connected to the connector 20 of the printed circuit board assembly 1. Further, since the whole of the printed circuit board assembly 1 except for a portion of the connector 20 is molded with the resin 50, the overall rigidity of a product, on which the printed circuit board assembly 1 is mounted, may be improved.

As is apparent from the above description, in the printed circuit board and the connecting method thereof in accordance example embodiments, even if the whole of the printed circuit board assembly is molded, the connection member may be freely connected to the connector of the printed circuit board assembly.

Further, a strong printed circuit board assembly, which is not easily broken due to falling or external impact, may be manufactured, and thus the overall rigidity of a product, on which the printed circuit board assembly may be mounted, may be improved.

Moreover, because the connector of the printed circuit board assembly and the connection member may be connected using a direct connecting method, bonding force between the connector of the printed circuit board assembly and the connection member may be increased.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A connecting method of a printed circuit board assembly comprising:
    molding the printed circuit board assembly by applying a resin to the printed circuit board assembly;
    exposing ends of the electrode terminals of a connector mounted on the printed circuit board by removing a portion of the molded printed circuit board assembly; and
    connecting a connection member to the exposed ends of the electrode terminals of the connector.

2. The connecting method according to claim 1, wherein exposing the ends of the electrode terminals of the connector mounted on the printed circuit board by removing a portion of the molded printed circuit board assembly includes removing a portion of the connector to expose the ends of the electrode terminals of the connector.

3. The connecting method according to claim 1, wherein exposing the ends of the electrode terminals of the connector mounted on the printed circuit board by removing a portion of the molded printed circuit board assembly includes removing a portion of the connector to open a surface of the connector to expose the ends of the electrode terminals of the connector.

4. The connecting method according to claim 3, wherein connecting the connection member to the exposed ends of the electrode terminals of the connector includes inserting the connection member to the opened surface of the connector.

5. The connecting method according to claim 3, wherein a height of a hole of the opened surface of the connector is smaller than a thickness of the connection member.

6. The connecting method according to claim 1, wherein connecting the connection member to the exposed ends of the electrode terminals of the connector includes using a direct connection method.

* * * * *